United States Patent
Yang et al.

(10) Patent No.: US 8,960,977 B2
(45) Date of Patent: Feb. 24, 2015

(54) ILLUMINATING DEVICE

(71) Applicant: LG Innotek Co., Ltd., Seoul (KR)

(72) Inventors: Hyun Duck Yang, Seoul (KR); Gwang Ho Park, Seoul (KR); Moo Ryoung Park, Seoul (KR); Chul Hong Kim, Seoul (KR); Jin Hee Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 222 days.

(21) Appl. No.: 13/686,675

(22) Filed: Nov. 27, 2012

(65) Prior Publication Data

US 2014/0043854 A1 Feb. 13, 2014

(30) Foreign Application Priority Data

Aug. 10, 2012 (KR) .................. 10-2012-0087769

(51) Int. Cl.
*F21V 13/02* (2006.01)
*F21V 13/12* (2006.01)
*F21V 8/00* (2006.01)
*H05K 1/00* (2006.01)
*F21S 8/10* (2006.01)
*F21Y 101/02* (2006.01)
*F21Y 105/00* (2006.01)

(52) U.S. Cl.
CPC .............. *F21V 13/12* (2013.01); *G02B 6/0001* (2013.01); *H05K 1/00* (2013.01); *F21S 48/215* (2013.01); *F21S 48/2212* (2013.01); *F21S 48/2243* (2013.01); *F21S 48/2268* (2013.01); *F21S 48/2281* (2013.01); *F21Y 2101/02* (2013.01); *F21Y 2105/001* (2013.01)
USPC .......................................... 362/488; 362/617

(58) Field of Classification Search
USPC ......... 362/612, 617, 618, 619, 620, 487, 488, 362/501
See application file for complete search history.

(56) References Cited

U.S. PATENT DOCUMENTS

| | | | |
|---|---|---|---|
| 2011/0051411 A1 | 3/2011 | Kim et al. | |
| 2013/0328090 A1* | 12/2013 | Park et al. | 257/98 |
| 2013/0335975 A1* | 12/2013 | Park et al. | 362/297 |
| 2014/0043819 A1* | 2/2014 | Yang et al. | 362/268 |

FOREIGN PATENT DOCUMENTS

| | | |
|---|---|---|
| EP | 2690356 A2 | 1/2014 |
| JP | 2001-091938 A | 4/2001 |
| JP | 2002-133930 A | 5/2002 |
| KR | 10-2007-0068885 A | 7/2007 |
| KR | 10-2012-0004222 A | 1/2012 |
| KR | 10-2012-0009209 A | 2/2012 |
| WO | WO-2008/099542 A1 | 8/2008 |

OTHER PUBLICATIONS

European Search Report in European Application No. 13179918.1, dated Oct. 23, 2014.

* cited by examiner

*Primary Examiner* — David V Bruce
(74) *Attorney, Agent, or Firm* — Saliwanchik, Lloyd & Eisenschenk

(57) ABSTRACT

Disclosed is an illuminating device which comprises a light guiding unit comprising a protrusion optical pattern forming a gap with an adjacent layer, at least one light emitting unit passing through the light guiding unit, and a resin layer formed on the light guiding unit and the at least one light emitting unit, so it is possible to obtain an effect that the shapes of light change depending on the viewing angle when viewing the light source by producing various protrusion optical patterns, an effect that the whole thickness can be reduced, and an effect that the degree of design freedom can be enhanced when designing products thanks to an enhanced flexibility.

22 Claims, 3 Drawing Sheets

ILLUMINATING DEVICE

CROSS-REFERENCE TO RELATED APPLICATION

This application claims the benefit under 35 U.S.C. §119 of Korean Patent Application No. 10-2012-0087769, filed Aug. 10, 2012, which is hereby incorporated by reference in its entirety.

BACKGROUND OF THE INVENTION

1. Field of the Invention

The present invention relates to an illuminating device, and in particular to an illuminating device structure which makes it possible to make the whole thickness thinner as such to obtain a high illuminating efficiency in such a way to remove a light guide plate and makes it possible to obtain an effect that the shape and a 3D effect of light change by forming a protrusion optical pattern.

2. Description of Related Art

The LED (Light Emitting Diode) device is directed to converting an electric signal into infrared ray or light using the natures of a compound semiconductor. Different from a fluorescent lamp, it does not use any harmful substances such as mercury, which results in less environment contamination, along with an advantage that service life is longer as compared to a conventional light source. It also consumes low electric power as compared to a conventional light source, and visibility is good thanks to a high color temperature and no glaring.

The illuminating device is currently changing from a type that a conventional incandescent lamp and a conventional fluorescent lamp are used as a light source to a type that a LED device is used as a light source. In particular, there is provided an illuminating device which performs a plane light emitting function by using a light guide plate as disclosed in the Korean Patent Publication number 10-2012-0009209.

FIGS. 1 and 2 are schematic views illustrating a conventional illuminating device 1 which can provide a plane light emitting function. As shown in FIGS. 1 and 2, the conventional illuminati device 1 is configured in such a way that a flat light guide plate 30 is arranged on a substrate 20, and a plurality of lateral type LEDs (only one is shown in the drawing for simplification) is arranged at a side of the light guide plate 30.

The light inputted from the LED 10 into the light guide plate 30 is reflected upward by means of a fine reflection pattern or a reflection sheet 40 which is disposed on a bottom surface of the light guide plate 30 and is emitted from the light guide plate 30, so the light can be emitted to the outside by way of an external housing 50, etc. which is made from a transparent material. As shown in FIG. 2, the above mentioned illuminating device 1 further features in that a plurality of optical sheets such as a diffusion sheet 31, prism sheets 32 and 33, a protection sheet 34, etc. are disposed between the light guide plate 30 and the external housing 50.

Here the illuminating device 1 serves to uniformly supply light to the outside, and the light guide plate 30 serves to enhance the luminance of the illuminating device 1 while ensuring that a uniform light can be supplied. In other words, it is a kind of a plastic formation lens configured to uniformly transfer the light emitted from the light source (LED). So, the above mentioned light guide plate 3 is used as a necessary element of the conventional illuminating device 1; however it has a limit in making a thinner product owing to the thickness itself of the light guide plate 30. Since the material of the light guide plate 30 is not flexible, it cannot be applied to the external housing 50, etc. which has curved surfaces, so the product design and the design changes are not easy.

BRIEF SUMMARY

Accordingly, the present invention is made to resolve the problems encountered in the conventional art. It is an object of the present invention to provide an illuminating device which makes it possible to make the whole thickness thinner in such a way that the light emitting from a light emitting unit is guided to the outside using a resin layer without using a light guide plate.

It is another object of the present invention to provide an illuminating device which provides a high degree of freedom when designing a product by allowing an illuminating device itself to have flexibility at an upper side of a PCB or a lower side of a diffusion member for thereby enhancing the reliability of a product.

It is further another object of the present invention to provide an illuminating device which provides a geometric optical pattern by forming a light guiding unit having a protrusion optical pattern between a resin layer and a reflection member.

To achieve the above objects, there is provided an illuminating device which comprises An illuminating device, comprising a light guiding unit comprising a protrusion optical pattern forming a gap with an adjacent layer; at least one light emitting unit passing through the light guiding unit; and a resin layer formed on the light guiding unit and the at least one light emitting unit.

Effects of the Invention

The present invention provides an effect that the number of light emitting units is reduced, and the whole thickness of an illuminating device can be made thinner by removing a light guide plate and guiding light using a resin layer.

In the present invention, the illuminating device is formed using a flexible PCB and a resin layer so as to obtain flexibility, thus enhancing a degree of freedom in a product design.

A light guiding unit with a protrusion optical pattern is provided between a resin layer and a reflection member, so an effect that the shape and a 3D feeling of light change depending on a viewing angle. An effect that the shape of a protrusion optical pattern changes can be obtained by forming an adhering pattern between a light guiding unit and a reflection member. In addition, an illuminating device with an enhanced aesthetic feeling can be provided, and the present invention can be applied to various fields.

In addition, since the present invention provides a reflection member and a reflection pattern which define a structure configured to efficiently reflect the light emitting from the light emitting unit, thus maximizing luminance along with the enhanced reflectivity of light. The uniform plane light source can be provided in the present invention.

A first optical substrate and a second optical substrate each having an optical pattern are provided in the present invention. An air gap is formed at the adhering layer, thus removing the generations of hot spots and a blackening phenomenon which occur at the light shield pattern portions, and the reliability of the elements adhered to the adhering layer can be enhanced, and the illuminating device with no significant differences in optical characteristics can be manufactured, and a precise alignment between elements can be obtained.

DETAILED DESCRIPTION

Figure 1:
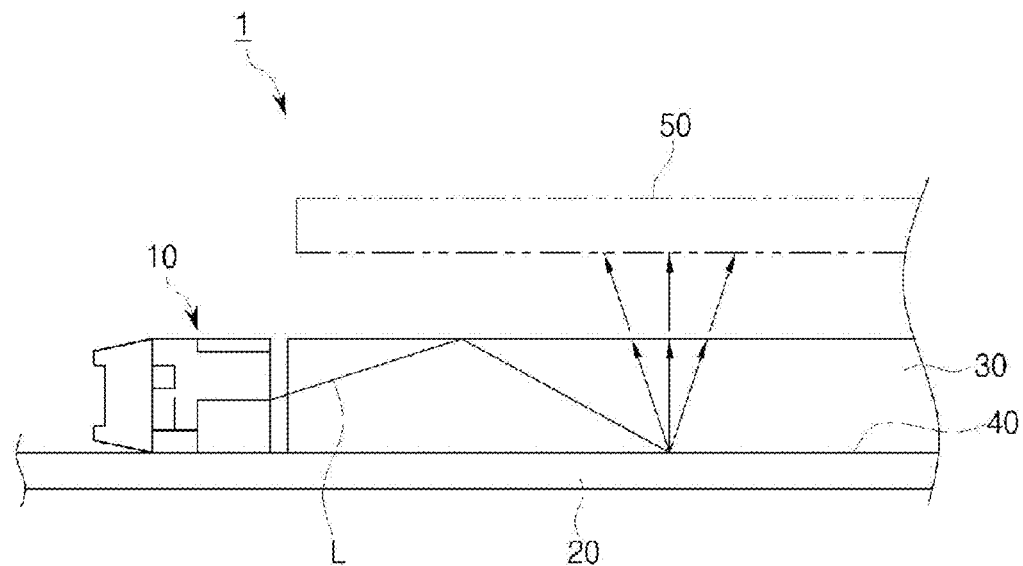
FIGS. 1 and 2 are schematic views illustrating the construction of a conventional illuminating device.
Figure 2:
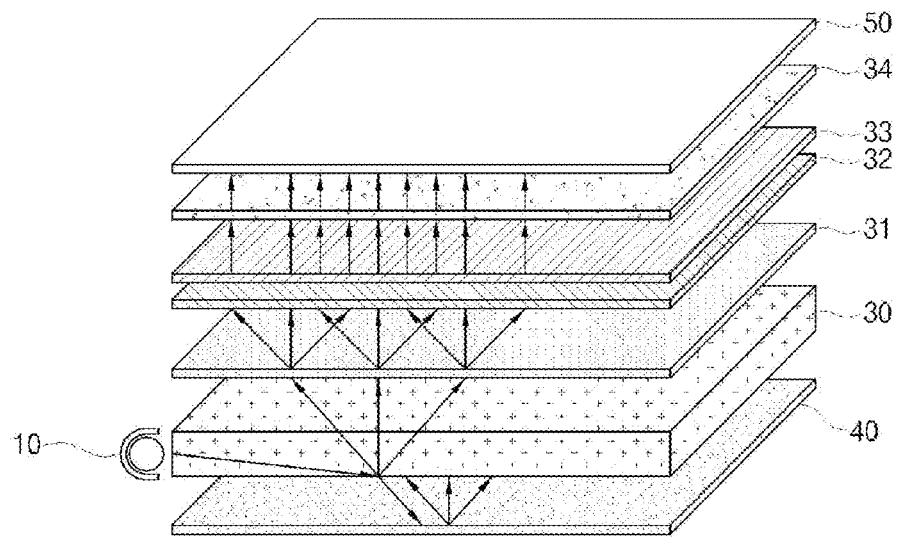

The preferred embodiments of the present invention that an ordinary person skilled in the art can implement will be described with reference to the accompanying drawings. The embodiments in the specification and the constructions shown in the drawings are provided as a preferred embodiment of the present invention, and it should be understood that there might be various equivalents and modifications which could substitute at the time of filing. In addition, when it comes to the operation principle of the preferred embodiments of the present invention, when the known functions or functions are seemed to make unclear the subject matters of the present invention, they will be omitted from the descriptions of the invention. The terms below are defined in consideration of the functions of the present invention, and the meaning of each term should be interpreted by judging the whole parts of the present specification, and the elements having the similar functions and operations of the drawings are given the same reference numerals.

The present invention is basically directed to an illuminating device using a LED as a light source, which features in that a light guide plate is removed, and a resin layer is formed instead, and a light guiding unit with a protrusion optical pattern is further provided between a reflection member and a resin layer, which makes it possible to be applied to various applications thanks to a geometric shape, not a simple plane surface light emission.

The illuminating apparatus of the present invention can be applied to various lamp devices which necessitate lighting for example a lamp for a vehicle, a lighting device at home and a lighting device for the purpose of industry. When it is applied to the lamp for a vehicle, its application includes a headlight, an indoor lighting in a vehicle, a door scuff, a rear lighting, etc. The illuminating device according to the present invention can be applied to a backlight unit field which is generally applied to a liquid crystal display. The present invention might be applied to all the lighting-related applications which have been already developed and then used or which would be implemented as the technology advances.

Figure 3:
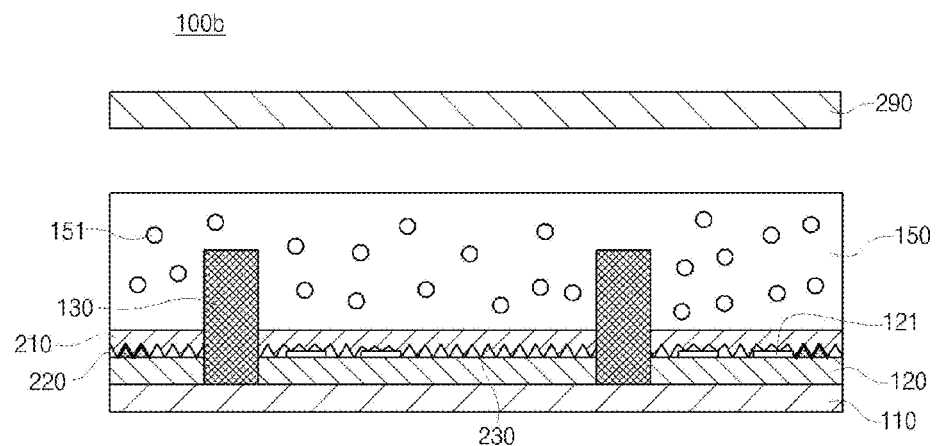
FIG. 3 is a view illustrating a major portion of an illuminating device according to the present invention.

FIG. 3 is a view illustrating the major portions of an illustrating device according to the present invention.

As shown in FIG. 3, the illuminating device 100a according to the present invention comprises a PCB (Printed Circuit Board) 110, at least one light emitting unit 130 disposed on the PCB 110, a reflection member 120 formed on the PCB 110 while passing through the light emitting unit 130, and a light guiding unit 210 having a protrusion optical pattern. A resin layer 150 is further provided, which buries the light emitting unit 130 and guides the emitting light in a forward direction.

In the above explained structure, there might be further provided a diffusion member 290 configured to uniformly diffuse the light inputted from the resin layer 150 and to diverge it to the outside.

The PCB 110 is a typical substrate formed as a circuit pattern is printed on a substrate. In the present invention, it is preferably formed of a flexible PCB (FPCB) so as to obtain flexibility.

The light emitting unit 130 is directed to emitting light as it is aligned in one or more numbers on the FPCB 110. The light emitting unit 130 of the present invention is formed of a side view type light emitting diode. In other words, the light emitting diode configured for the emitting light to travel in a lateral direction, not traveling upward, can be applied to the light emitting unit 130 of the present invention. The illuminating device 100a of the present invention is characterized in that the light emitting unit 130 formed of lateral type light emitting diodes is arranged in a direct type. The number of the whole light emitting units can be reduced by diffusing and guiding the light toward the diffusion member 290 by using a resin layer which has a light diffusion function and a reflection function, and the whole weight and thickness of the illuminating device can be significantly reduced.

The resin layer 150 is formed on the upper sides of the light guiding unit 210 and the light emitting unit 130, and the resin layer 150 serves to guide the light from the light emitting unit 130 to diffuse forward. In other words, the resin layer 150 is configured to bury the light emitting unit 130, thus spreading the light emitted from the light emitting unit 130 in a lateral direction. In other words, the function of the conventional light guide plate can be performed by means of the resin layer 150.

The resin layer 150 of the present invention is made from a resin material which can diffuse light. For example, the resin layer 150 of the present invention is made from an ultraviolet curable resin containing oligomer. More specifically, the resin layer 150 is made from a resin containing urethane acrylate oligomer as a main material. A resin mixed with urethane acrylate oligomer and polyacryl polymer type might be used. Of course, a monomer mixed with IBOA (isobornyl acrylate), HPA (hydroxylpropyl acrylate), 2-HEA (2-hydroxyethyl acrylate), etc. which are low boiling point dilution type reaction monomers might be further contained. As an additive, photoinitiator (1-hydroxycyclohexyl phenyl-ketone, etc.) or antioxidant can be mixed. The above mentioned examples are provided only for illustrative purposes. In addition thereto, a resin layer 150 of the present invention could be formed using a certain resin which is currently under developments and used or all kinds of resins having light diffusion functions which would be developed in the future as the technology advances.

A plurality of beads 151 each having pores might be further contained in the interior of the resin layer 150 of the present invention in a mixed form or a diffused form. The beads 151 server to enhance the reflection and diffusion of light. For example, when light outputted from the light emitting unit 130 is inputted into the beads 151 in the interior of the resin layer 150, the light is reflected by the pores of the beads 151 and transmits and focuses, so the light emits in the upward direction of the resin layer.

When the illuminating apparatus of the present invention includes a diffusion member 290, the focused light diffused from the resin layer is outputted to the diffusion member 290. At this time, the reflectivity and diffusion rate of the light increase thanks to the beads 151, so the light intensity and uniformity of the emitting light supplied to the diffusion member 290 are enhanced, and consequently the luminance of the illuminating device can be enhanced.

The contents of the beads 151 can be properly adjusted so as to obtain a targeted light diffusion effect. In more details, it can be adjusted within a scope of 0.01~0.3 weight % as compared to the whole resin layer 150, but it is not limited to it. The light emitting in the lateral direction from the light emitting unit 130 can be diffuse and reflected by way of the resin layer 150 and the beads 151 and can travel upward. The beads 151 might be made from one among silicon, silica, glass bubble, PMMA, urethane, Zn, Zr, $Al_2O_3$, and acryl. The diameter of each bead 151 might be in a scope of 1 µm-20 µm, but it is not limited to it.

In the present invention, thanks to the presence of the resin layer 150, it is possible to significantly reduce the thickness which used to occupy a lot of areas in the conventional light guide plate, and the product can be made thinner and compact. The material is flexible, so it can be well applied to curved surfaces. A degree of freedom in term of the designs of products can be enhanced, and the present invention can be well applied to flexible displays.

The illuminating apparatus according to the present invention might be implemented in a structure by further comprising a diffusion member 290. In this case, the diffusion member 290 is formed on the upper side of the resin layer 150 while ensuring that the light inputted via the resin layer 15 can be uniformly diffused over the whole front surfaces. The diffusion member 290 is generally made from an acryl resin, but it is not limited thereto. All kinds of materials can be used as long as such materials have diffusion functions like high transmissivity plastic such as polystyrene (PS), poly methyl metacrylate (PMMA), circular olefin copoly (COC), poly ethylene terephthalate (PET), resin, etc.

As not shown in the drawings, a protrusion reflection pattern might be formed at a lower surface of the diffusion member 290. Here, the protrusion reflection pattern represents that protruded patterns are uniformly or non-uniformly arranged to make sure that the externally emitting light can have geometric patterns by reflecting and diffusing the inputting light. The above mentioned protrusion reflection pattern is formed in a structure formed of a plurality of patterns. So as to enhance the reflection and diffusion effects of light, it can be formed in a prism shape, a lenticular shape, a concave lens shape, a convex lens shape or a combination of at least two shapes, but it is not limited to them. In addition, the cross section of the protrusion reflection pattern might be formed in various shapes such as a triangle shape, a quadrangle shape, a semi-circular shape, a sine wave shape, etc. It can be configured in a structure which could change the size or density of each pattern depending on the distance from the light emitting unit 130. The protrusion reflection pattern according to the present invention might be formed by directly processing the diffusion member 290, but it is not limited to it. All kinds of possible methods that have been developed or are under developments or would be developed in the future can be used including a method that a film having regular patterns is attached to the diffusion member 290.

A first spacing part 280 can be formed between the diffusion member 290 and the resin layer 150. At this time, thanks to the presence of the first spacing part 280, the uniformity of light supplied from the diffusion member 290 can be enhanced. Consequently, the present invention can have an effect that the uniformity of light diffused and outputted via the diffusion member 290 can be enhanced and an effect that the uniform plane surface light emission can be obtained. In an attempt to minimize the deviations of light which has passed through the resin layer 150, the thickness H1 of the first spacing part 280 is preferably in a range of 0 to 20 mmm but it is not limited to it, and if necessary, it can be changed by way of a proper design change.

The reflection member 120 is formed on an upper surface of the PCB 110 and is formed in a structure that the light emitting unit 130 passes through. The reflection member 120 according to the present invention is made from a material with a high reflection efficiency, so the light outputted from the light emitting unit 130 is reflected toward the upper side where the diffusion member 290 is positioned, thus reducing the loss of light. The above mentioned reflection member 120 might be formed in a film shape and might be formed by including a synthetic resin which spread-contains white pigment so as to implement the natures helping promote the reflection and diffusion of light. For example, the white pigment might be titanium dioxide, aluminum oxide, zinc oxide, carbonate, barium sulfate, calcium carbonate, etc, and the synthetic resin is polyethylene terephthalate, polyethylene, naphthalate, acryl resin, polycarbonate, polystyrene, polyolefin, cellulose acetate, weatherproof vinyl, etc., but such material is not limited to them.

A reflection pattern 121 might be formed on the surface of the reflection member 120. The reflection pattern 221 serves to scatter and disperse the inputting light to make sure that the light is uniformly inputted into the diffusion member 290. The reflection pattern 121 can be formed by printing on the surface of the reflection member 120 a reflection ink which contains one among $TiO_2$, $CaCO_3$, $BaSO_4$, $Al_2O_3$, Silicon, PS, etc., and such method is not limited to it.

The light guiding unit 210 might be arranged on the upper surface of the reflection member 120 and is formed in a structure that a protrusion optical pattern, is formed on the surface facing the reflection member 120. At this time, the light guiding unit 210 might be formed of a prism sheet consisting of a plurality of unit prism lens, a micro lens array sheet, a lenticular lens sheet or a combination formed of at least two of them.

As shown in the drawings, with the aid of the protrusion optical pattern, a gap 230 is formed between the light guiding unit 210 and the reflection member 120, and an adhering pattern 220 is formed in a shape corresponding to the protrusion optical pattern for the purpose of adhering the light guiding unit 210 and the reflection member 120. The gap 230 working as an air layer is not formed at the portion where the adhering pattern 220 is formed. Since the present invention comprises a light guiding unit 210 such as a prism sheet, etc. where a protrusion optical pattern is formed, not a simple plane surface light emission, a geometric optical pattern can be formed, and the shape and 3D feeling of the light can change depending on the viewing angle.

At this time, the intensity of light can be adjusted by forming a pattern on the reflection member 120 using a reflection ink. The shape of the protrusion optical pattern can be changed using the adhering pattern 220 formed between the reflection member 120 and the light guiding unit 210.

Figure 4:
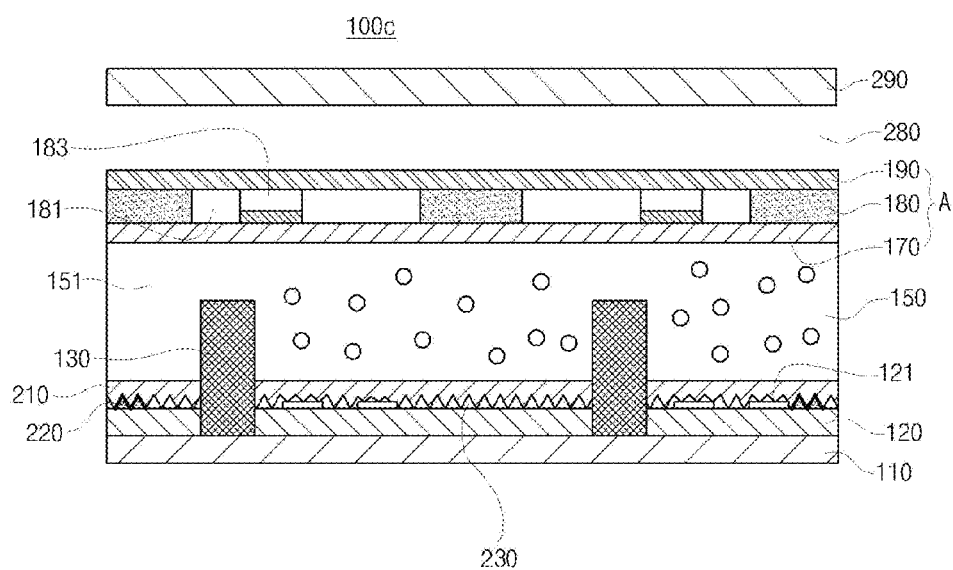
FIG. 4 is a view illustrating a structure that an optical substrate is added to an illuminating device of FIG. 3 according to the present invention.

FIG. 4 is a view illustrating a structure 100c that an optical sheet is added to the illuminating apparatus of the present invention. As shown in FIGS. 3 and 4, the illuminating apparatus 100c of the present invention further comprises a first optical sheet 170 which is formed between the resin layer 150 and the diffusion member 290 and is formed on the upper surface 150 of the resin layer, a second optical sheet 190 formed on the first optical sheet 170 and an adhering layer 180 disposed between the first optical sheet 170 and the second optical sheet 190. A second spacing part 181 might be further formed at the adhering layer 180. In other words, the adhering layer 180 forms a space (second spacing part 181) around the optical patterns 183, and an adhering substance is coated on the other portions, so the first optical sheet 170 and the second optical sheet 190 are adhered with each other. In addition, an optical pattern 183 might be further formed on the upper surface of the first optical sheet 170 or the lower surface of the second optical sheet 190, and at least one optical sheet might be further formed on the second optical sheet 190. The structure formed of the first optical sheet 170, the second optical sheet 190, the adhering sheet 180 and the optical pattern 183 can be defined as an optical pattern layer A.

The optical pattern 183 formed on the upper surface of the first optical sheet 17 or the lower surface of the second optical sheet 190 might be formed of a light shielding pattern so as to prevent the light from the light emitting unit 160 from focusing. For this, it is needed to align between the optical pattern 183 and the light emitting unit 130. The first optical sheet 170 and the second optical sheet 190 are adhered using the adhering layer 180 so as to obtain a stable fixing force after the aligning procedure.

The first optical sheet 170 and the second optical sheet 190 might be made from materials having high light transmissivity, for example, they can be made from PET.

The optical pattern 183 disposed between the first optical sheet 17 and the second optical sheet 190 serve to prevent the light from the light emitting unit 130 from not focusing. A light shielding pattern might be provided to produce a partial light shielding effect so as to prevent the optical characteristics from worsening owing to too high intensity of light or the yellow light from becoming yellowish. The above mentioned light shielding pattern can be formed by means of a printing process on the upper surface of the first optical sheet 170 or the second optical sheet 190 using a light shielding ink.

The optical pattern 183 might be configured to adjust the light shielding degree or diffusion degree using one optical pattern so that the light can be fully shielded or part of the light can be shielded along with the light diffusion function. More specifically, the optical pattern 183 of the present invention might be implemented in a double printing structure of a combined pattern. Here, the structure of a double printing structure represents a structure formed as one pattern is formed, and then another pattern is formed on the same.

For example, the optical pattern might be formed as a diffusion pattern formed on a lower surface of a polymer film (for example, second optical sheet) in the emitting direction of light using a light shielding ink containing at least one among $TiO_2$, $CaCO_3$, $BaSO_4$, $Al_2O_3$, silicon, etc. and a light shielding pattern formed using a light shielding ink containing Al or a mixture of Al and $TiO_2$ are formed in a double structure.

A diffusion pattern is white-printed on the surface of the polymer film, and a light shielding pattern might be formed on it, and on the contrary, the double structure could be formed in the sequence opposite to it. It is obvious that the formed design of such patterns might change in various forms depending on the efficiency, intensity and light shielding ratios of light. Alternatively, there might be provided a triple structure in which a light shielding pattern formed of a metallic pattern is formed at the center of the sequential stacking structure and the diffusion pattern is formed at the upper side and the lower side, respectively. The above mentioned triple structure could be implemented by selecting one of the above mentioned materials. Preferably, one of the diffusion patterns might be formed using $TiO_2$ having a good refractive index. Another diffusion pattern might be formed using $CaCO_3$ having a good optical stability and a good-looking color along with $TiO_2$. The efficiency and uniformity of light can be obtained with the aid of the triple structure which implements the light shielding patterns using Al which has a good hiding function. In particular, $CaCO_3$ has a function of providing white light with the aid of a function of reducing the exposure of yellow light, thus obtaining more stable illuminating effects. An inorganic material having a larger particle size and a similar structure such as $BaSO_4$, $Al_2O_3$, silicon bead, etc. except for $CaCO_3$ could be applied. In addition, it is preferred that the optical pattern 183 is formed to have a good illuminating efficiency by adjusting the pattern density so that the pattern density gets lower as it becomes farther from the emitting direction of the LED light source.

The adhering layer 180 might be formed in a structure that the peripherals of the optical pattern 183 is surrounded, and a second spacing part 181 is formed at the other portions or in a structure that a second spacing part 181 is formed around the optical pattern 183. So, an alignment can be obtained by adhering two optical sheets. In other words, the adhering structure of the first optical sheet 170 and the second optical sheet 190 serves to fix the printed optical patterns 183.

At this time, the adhering layer 180 might be made from a thermosetting PSA, a thermosetting adhesive or a UV curable PSA type substance, but it is not limited to them.

As shown in FIG. 3, the first spacing part 280 might be formed between the second optical sheet 190 and the diffusion member 290. Tanks to the presence of the first spacing part 280, the uniformity of the light supplied to the diffusion member 290 can be enhanced, and consequently, the uniformity of the light diffused and emitted by way of the diffusion member 290 can be enhanced. At this time, the thickness H1 of the first spacing part 280 is in a range of 0 to 20 mm in order to minimize the deviations of the light which passes through the resin layer 150, but it is not limited to it. If necessary, it can change properly depending on the necessities as shown in FIG. 3.

As not shown in the drawings, at least one optical sheet can be further formed on the optical pattern layer "A" if needed.

Figure 5:
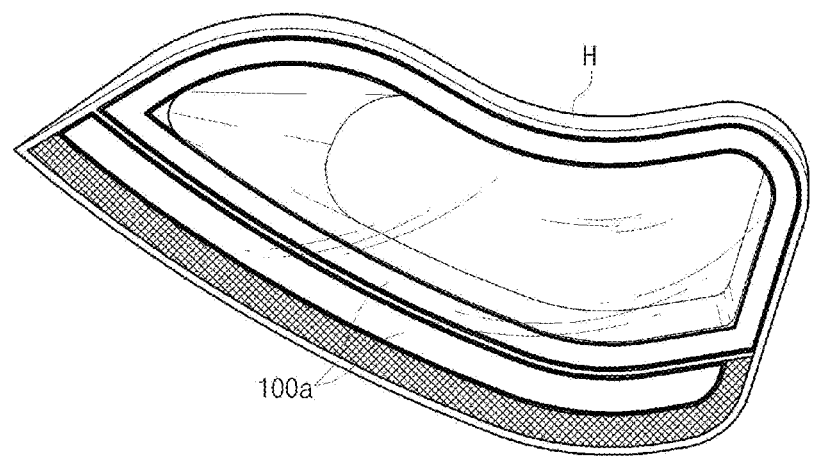
FIG. 5 is a schematic view illustrating a structure that an illuminating device is applied to a headlight for a vehicle according to the present invention.

FIG. 5 is a schematic view illustrating a structure that an illuminating device is applied to a headlight for a vehicle according to the present invention.

Figure 6:
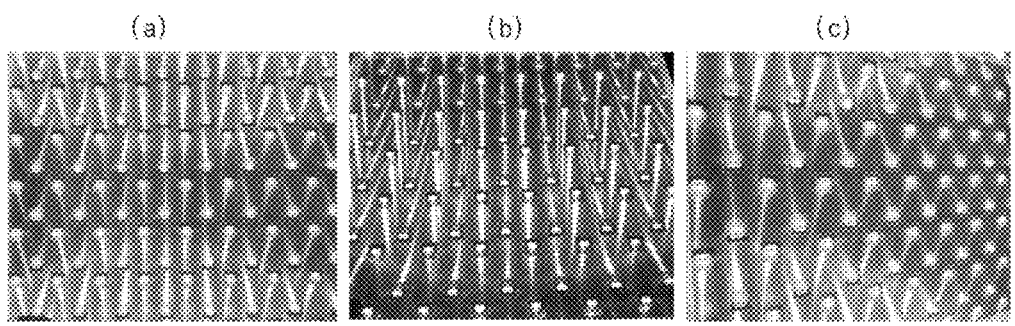
FIG. 6 is a view illustrating an actual operation state image of an illuminating apparatus according to the present invention.

As shown in FIG. 5, the illuminating device 100a according to the present invention is formed using a flexible circuit board and a resin layer, so the illuminating device itself has flexibility. As shown in FIG. 6, thanks to such flexibility, the present invention can be easily applied to the headlight housing 300 for a vehicle with curved surfaces. The degree of design freedom for the sake of a finished product engaged with the housing can be enhanced. Separate from the effect and design freedom, uniform brightness and luminance can be obtained. FIG. 5 shows that the illuminating device of FIG. 3 is engaged, but it is provided only for an illustrative purpose, and the illuminating device of FIG. 4 might be engaged.

FIG. 6 is a view illustrating an actual operation state image at the front side, bottom side and lateral side of the illuminating device according to the present invention. As shown in FIG. 6, thanks to the protrusion optical patterns, the shapes of light can visually change depending on the viewing angle when viewing the light source.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:
1. An illuminating device, comprising:
   a light guiding unit comprising, a protrusion optical pattern forming a gap with an adjacent layer, at least one light emitting unit passing through the light guiding unit, and a resin layer formed on the light guiding unit and the at least one light emitting unit.

2. The illuminating device of claim 1, wherein the light guiding unit comprises any one of a prism sheet having a plurality of unit prism lens patterns, a micro lens array sheet and a lenticular lens sheet, or a combination thereof.

3. The illuminating device of claim 1, wherein the protrusion optical pattern is formed on the other surface coming into contact with the resin layer.

4. The illuminating device of claim 1, further comprising a printed circuit board (PCB) provided at the lower part of the light guiding unit.

5. The illuminating device of claim 4, further comprising a reflection member between the PCB and the light guiding unit.

6. The illuminating device of claim 5, wherein between the light guiding unit and the reflection member is formed an adhering pattern.

7. The illuminating device of claim 5, wherein on the reflection member is formed a reflection pattern.

8. The illuminating device of claim 7, wherein on the reflection pattern is formed a reflection ink containing one selected from the group consisting of $TiO_2$, $CaCO_3$, $BaSO_4$, $Al_2O_3$, Silicon and PS.

9. The illuminating device of claim 1, further comprising a diffusion member on an upper side of the resin layer.

10. The illuminating device of claim 9, where between the resin layer and the diffusion member is formed a first spacing part.

11. The illuminating device of claim 10, wherein the first spacing part has a thickness which is greater than zero up to 20 mm.

12. The illuminating device of claim 1, further comprising a first optical sheet formed on an upper surface of the resin layer and disperses an emitting light.

13. The illuminating device of claim 12, further comprising a second optical sheet formed on the first optical sheet.

14. The illuminating device of claim 13, further comprising an adhering layer formed between the first optical sheet and the second optical sheet.

15. The illuminating device of claim 14, wherein the adhering layer forms a second spacing part which spaces apart the first optical sheet and the second optical sheet.

16. The illuminating device of claim 15, wherein an optical pattern is formed on either an upper surface of the first optical sheet or a lower surface of the second optical sheet for the purpose of shielding or reflecting an emitting light.

17. The illuminating device of claim 16, wherein the optical pattern is formed in a double structure in which a diffusion pattern formed using a light shielding ink containing at least one selected from the group consisting of $TiO_2$, $CaCO_3$, $BaSO_4$ and Silicon and a light shielding pattern formed using a light shielding ink containing Al or a mixture of Al and $TiO_2$ form the double structure.

18. The illuminating device of claim 17, wherein the diffusion pattern is printed on either an upper surface of the light shielding pattern or a lower surface of it.

19. The illuminating device of claim 1, wherein the resin layer is formed of an ultraviolet ray thermosetting resin containing oligomer.

20. The illuminating device of claim 2, wherein the oligomer contains at least one selected from the group consisting of urethane acrylate, epoxy acrylate, polyester acrylate and acrylic acrylate.

21. The illuminating device of claim 20, wherein the resin layer further contains a plurality of beads each made from one selected from the group consisting of silicon, silica, glass bubble, PMMA, urethane, Zn, Zr, $Al_2O_3$ and acryl.

22. The illuminating device of claim 4, wherein the PCB is formed of a flexible PCB.

* * * * *